US012713735B2

(12) United States Patent
Soon-Shiong

(10) Patent No.: US 12,713,735 B2
(45) **Date of Patent: *Aug. 18, 2026**

(54) WIRELESS POWER BEAM ROUTING INFRASTRUCTURE SYSTEMS AND METHODS

(71) Applicant: Nant Holdings IP, LLC, Culver City, CA (US)

(72) Inventor: Patrick Soon-Shiong, Los Angeles, CA (US)

(73) Assignee: Nant Holdings IP, LLC, Culver City, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/019,257

(22) Filed: Jan. 13, 2025

(65) Prior Publication Data

US 2025/0151455 A1 May 8, 2025

Related U.S. Application Data

(60) Division of application No. 17/321,303, filed on May 14, 2021, now Pat. No. 12,243,951, which is a (Continued)

(51) Int. Cl.
*F21S 11/00* (2006.01)
*F21S 9/03* (2006.01)
(Continued)

(52) U.S. Cl.
CPC ............ *H10F 77/484* (2025.01); *H02J 50/20* (2016.02); *H10F 77/488* (2025.01); *F21S 9/032* (2013.01);

(Continued)

(58) Field of Classification Search
CPC .. H02J 50/20; H02J 50/12; H02J 50/80; H02J 50/005; H02J 50/30; H10F 77/484;
(Continued)

(56) References Cited

U.S. PATENT DOCUMENTS 4,411,490 A * 10/1983 Daniel .................... F21S 11/00 136/246
4,496,211 A 1/1985 Daniel
(Continued)

FOREIGN PATENT DOCUMENTS

EP 0907866 B1 6/2008
GB 2440366 A 1/2008
(Continued)

OTHER PUBLICATIONS

Clarke, "More Good News About the Scientific Accident That May Change the World," https://www.kcet.org/redefine/more-good-news-about-the-scientific-accident-that-may-change-the-world, KCET.org, Feb. 21, 2013, 4 pages.

(Continued)

*Primary Examiner* — Elim Ortiz
(74) *Attorney, Agent, or Firm* — MASCHOFF BRENNAN; Andrew A. Noble; Elaine K. Lee

(57) ABSTRACT

Apparatus, methods and systems of wireless power distribution are disclosed. Embodiments involve the redirection of collimated energy to a converter, which stores or converts the energy into a more suitable form of energy for at least one specific point-of-use that is coupled to the converter.

22 Claims, 6 Drawing Sheets

Related U.S. Application Data continuation of application No. 16/572,512, filed on Sep. 16, 2019, now Pat. No. 11,038,074, which is a continuation of application No. 15/707,925, filed on Sep. 18, 2017, now Pat. No. 10,418,842, which is a continuation of application No. 14/401,112, filed as application No. PCT/US2013/042630 on May 24, 2013, now Pat. No. 9,793,760.

(60) Provisional application No. 61/651,139, filed on May 24, 2012.

(51) Int. Cl.

| | |
|---|---|
| ***F24S 23/00*** | (2018.01) |
| ***H02J 50/20*** | (2016.01) |
| ***H10F 77/42*** | (2025.01) |
| *H02J 50/30* | (2016.01) |

(52) U.S. Cl.
CPC .............. *F21S 11/007* (2013.01); *F24S 23/12* (2018.05); *H02J 50/30* (2016.02); *Y02E 10/52* (2013.01)

(58) Field of Classification Search
CPC ....... H10F 77/488; F21S 11/007; F21S 9/032; F24S 23/12; Y02E 10/52; Y02T 10/70
USPC ........................................... 307/104; 320/108
See application file for complete search history.

(56) References Cited

U.S. PATENT DOCUMENTS

| | | | | |
|---|---|---|---|---|
| 5,501,743 | A * | 3/1996 | Cherney | H10F 77/484 136/246 |
| 6,437,925 | B1 | 8/2002 | Nishioka | |
| 6,691,701 | B1 * | 2/2004 | Roth | F24S 50/00 126/685 |
| 6,912,816 | B2 | 7/2005 | O'Leary | |
| 7,619,809 | B2 | 11/2009 | Blum et al. | |
| 8,068,282 | B1 | 11/2011 | Kastner | |
| 9,793,760 | B2 | 10/2017 | Soon-Shiong | |
| 10,418,842 | B2 | 9/2019 | Soon-Shiong | |
| 11,038,074 | B2 | 6/2021 | Soon-Shiong | |
| 2002/0085393 | A1 * | 7/2002 | Eisenman | G02B 6/0096 362/228 |
| 2004/0173257 | A1 | 9/2004 | Rogers et al. | |
| 2004/0227057 | A1 | 11/2004 | Tuominen et al. | |
| 2007/0012349 | A1 | 1/2007 | Gaudiana et al. | |
| 2010/0207572 | A1 | 8/2010 | Kirby et al. | |
| 2010/0271802 | A1 | 10/2010 | Recker et al. | |
| 2011/0049992 | A1 | 3/2011 | Sant'Anselmo et al. | |
| 2011/0272002 | A1 | 11/2011 | Liu | |
| 2012/0011782 | A1 | 1/2012 | Kolaas et al. | |
| 2015/0096937 | A1 * | 4/2015 | Munro | C02F 1/441 |
| 2021/0343889 | A1 | 11/2021 | Soon-Shiong | |
| 2023/0286832 | A1 * | 9/2023 | AlShareef | C02F 1/24 |

FOREIGN PATENT DOCUMENTS

| | | | |
|---|---|---|---|
| WO | 2005/088209 | A1 | 9/2005 |
| WO | 2009/070316 | A1 | 6/2009 |
| WO | 2010/003115 | A1 | 1/2010 |

OTHER PUBLICATIONS

International Preliminary Report on Patentability received for PCT Patent Application No. PCT/US2013/042630, mailed on Sep. 8, 2014, 21 pages.

International Search Report and Written Opinion issued in International Application No. PCT/US2013/042630 dated Oct. 21, 2013, 10 pages.

Suncentral, Inc., "Our Solution: Turning the Lights off With Sunlight," downloaded from http://web.archive.org/web/20120426164429/http://www.suncentral.inc on May 14, 2013, 1 page.

* cited by examiner

WIRELESS POWER BEAM ROUTING INFRASTRUCTURE SYSTEMS AND METHODS

This application is a divisional of U.S. application Ser. No. 17/321,303, filed May 14, 2021, which is a continuation of Ser. No. 16/572,512, filed Sep. 16, 2019, which is a continuation of U.S. application Ser. No. 15/707,925, filed Sep. 18, 2017, which is a continuation of U.S. application Ser. No. 14/401,112, filed Nov. 13, 2014, which is the national phase filing of International Application No. PCT/US2013/042630, filed May 24, 2013, which claims the benefit of priority to U.S. Provisional Application No. 61/651,139, filed May 24, 2012. These and all other extrinsic materials discussed herein are incorporated by reference in their entirety.

FIELD OF THE INVENTION

The field of the invention is wireless power distribution, use, and storage.

BACKGROUND

The background description includes information that may be useful in understanding the present invention. It is not an admission that any of the information provided herein is prior art or relevant to the presently claimed invention, or that any publication specifically or implicitly referenced is prior art.

The United States consumes approximately 25% of the world's supply of fossil fuels even though it represents only about 5% of the world's population. The combustion of fossil fuels produces greenhouse gas emissions and various other air pollutants, which is considered harmful to the environment. Due to harmful effects and limited supply of fossil fuels, use of some alternative technologies, including solar energy technologies have become increasingly popular.

Some previous efforts have been directed toward design of passive solar energy collection techniques applied to buildings. Such efforts include architectural designs having features that absorb large amounts of solar energy for heat and direct natural air circulation. Other efforts include using materials that have favorable thermal properties. Still further, others have put forth efforts in developing active solar technologies including using photovoltaic technologies to generate electricity.

European Patent Number 907866 to Franklin titled "Optical Conduit for Transmitting and Releasing Luminescent Radiation," filed on Jun. 17, 1997 describes a system that distributes light through optical conduits to a point of illumination. Solar energy is collected externally of a building and used to illuminate an area inside the building. Such techniques for useful for passive solar-based illumination, but does not provide power to a device.

Example of efforts that use active solar technologies to provide power include the techniques described in International Application WO 2009/070316 to Retti titled "Autonomous, Modular Power Generation, Storage and Distribution Apparatus, Systems and Methods Thereof," filed on Nov. 26, 2008; International Application WO 2010/0003115 to Zalusky et al. titled "Solar Collector Assembly," filed on Jul. 2, 2009; and United States Patent Application Publication Number 2011/0049992 to Sant'Anselmo et al. titled "Systems, Methods, and Devices Including Modular, Fixed and Transportable Structures Incorporating Solar and Wind Generation Technologies For Production of Electricity," filed on Aug. 27, 2010. While the systems described in Retti, Zalusky, and Sant'Anselmo collect and convert solar energy to provide power to various spaces, they are not as efficient or cost-effective as would be desired.

U.S. Pat. No. 6,912,816 to O'Leary titled "Structurally Integrated Solar Collector," filed on Sep. 30, 2002, describes using solar collectors on roof and wall covering to convert solar energy into heat and electricity for distribution throughout a building. Unfortunately, O'Leary is also not as efficient or cost-effective as desired because it provides heat and electricity throughout the building as a whole and not favorably to areas near a specific point of power consumption.

United States Patent Application Publication Number 2007/0012349 to Gaudiana et al. titled "Photovoltaic Sensor Facilities In a Home Environment." filed on Jun. 27, 2005 attempts to provide a more efficient system, and describes embodiments wherein a sensor (e.g. smoke detector) could be provided in association with a photovoltaic facility (e.g. solar cell) to form a sensor-photovoltaic facility, which can be turned into a kit that people can use in a home environment. However, Gaudiana's attempts to only utilizes ambient light and fails to provide a way to increase an amount of energy available for such device.

These and all other extrinsic materials discussed herein are incorporated by reference in their entirety. Where a definition or use of a term in an incorporated reference is inconsistent or contrary to the definition of that term provided herein, the definition of that term provided herein applies and the definition of that term in the reference does not apply.

The above cited systems are apparently inefficient and unsatisfactory because the points-of-conversion are distant from the points of power consumption, and because the points of power consumption lack sufficient power for many point of use devices. For example, systems that collect and convert solar energy exterior to a structure for use inside of a structure are sometimes inefficient because much of the converted energy is lost before even reaching a point of power consumption. As another example, systems that collect and convert ambient light at or near a point-of-use are inefficient because ambient light apparently does not provide sufficient energy to power a device for extended uses.

It has yet to be appreciated that solar energy collected exterior to a structure could be converted and stored near a point of power consumption, which would yield greater efficiency.

Thus, there is still a need for improved wireless power distribution.

SUMMARY OF THE INVENTION

The inventive subject matter provides apparatus, systems and methods wherein one form of energy is collected and collimated to form a power beam that is wirelessly distributed to a power converter that provides power at a point-of-use or point-of-consumption. Once the power beam reaches the converter, it can be converted immediately to useable electricity, or stored for a later conversion or use. The distribution of the power beam could be achieved through the use of one or more redirectors directing it via one or more pathways.

Various objects, features, aspects and advantages of the inventive subject matter will become more apparent from the following detailed description of preferred embodiments, along with the accompanying drawing figures in which like numerals represent like components.

DETAILED DESCRIPTION

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

Figure 1:
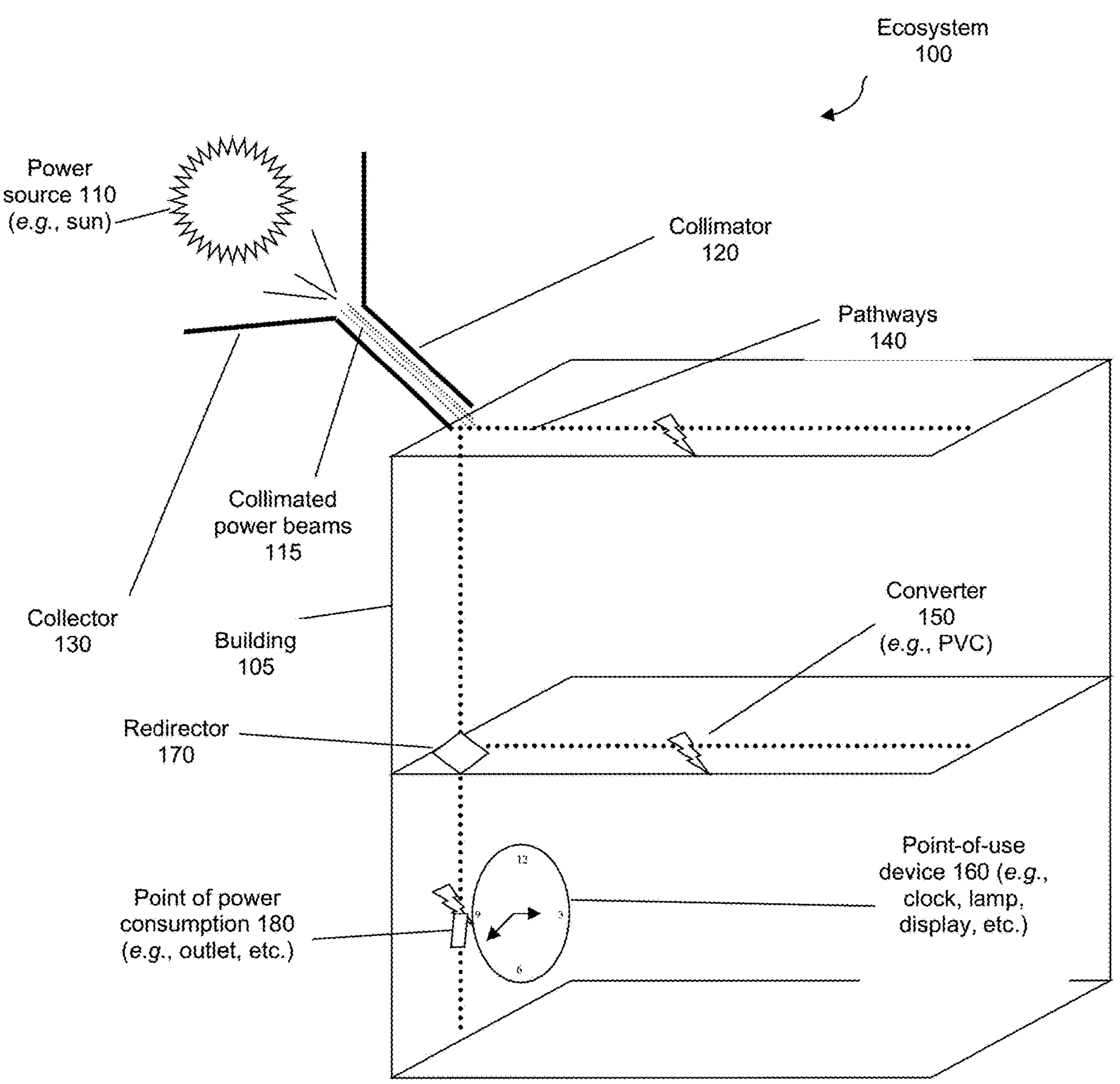
FIG. 1 is a schematic of one embodiment of a wireless power distribution ecosystem of the inventive subject matter.

FIG. 1 is an example of an embodiment of a wireless power distribution ecosystem of the inventive subject matter. Ecosystem 100 comprises a power source 110 outside of building 105; in this example the Sun. Ambient solar energy from power source 110 is collected via collector 130 for distribution to within a structure. The collected solar energy is then collimated by collimator 120 to form collimated power beams 115, which are distributed throughout building 105 via a plurality of wireless pathways 140 as determined by a plurality of redirectors 170.

Figure 3A:
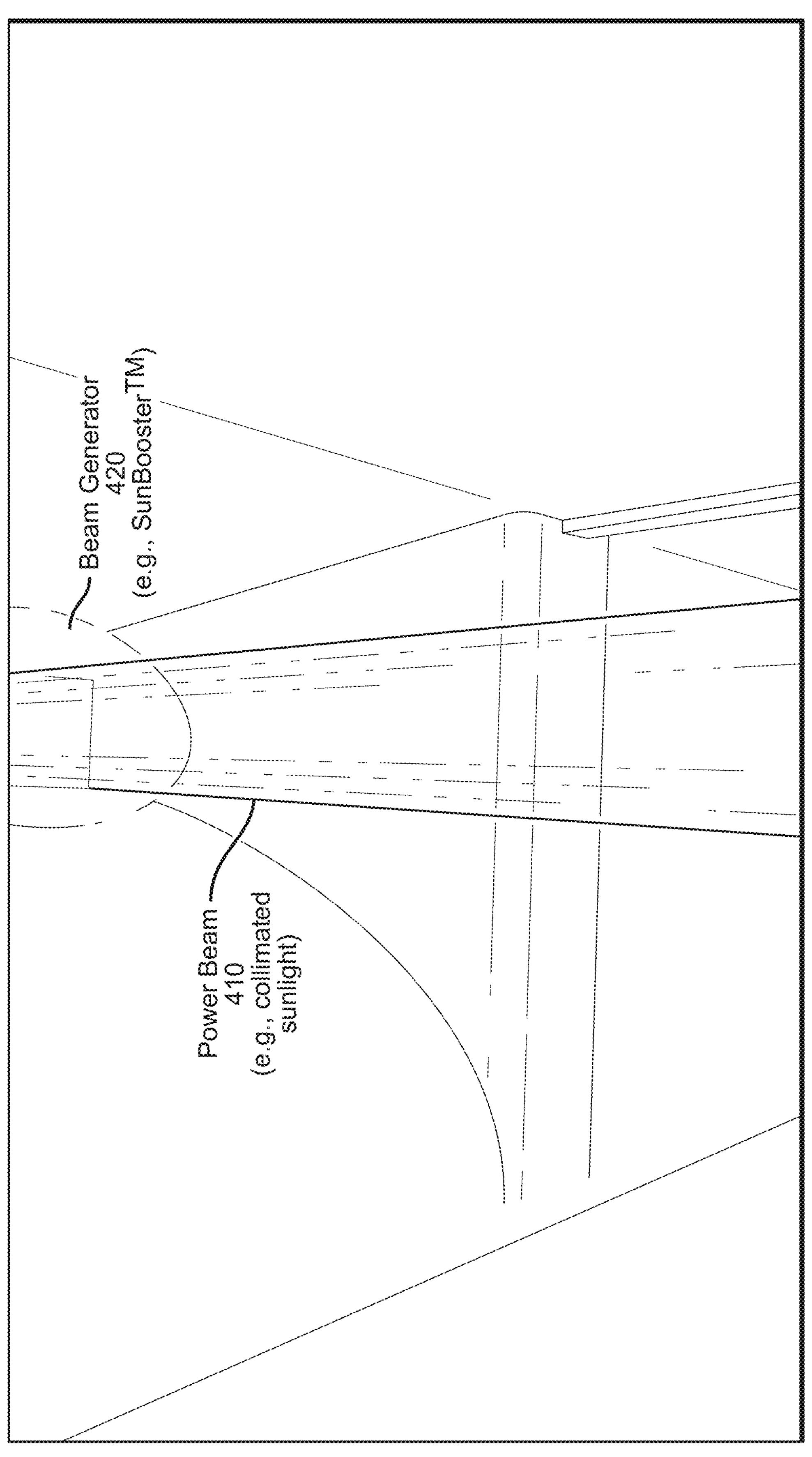
FIG. 3*a* illustrates a real-world power beam of collimated sunlight directed through a ceiling in a gymnasium under construction.
Figure 3B:
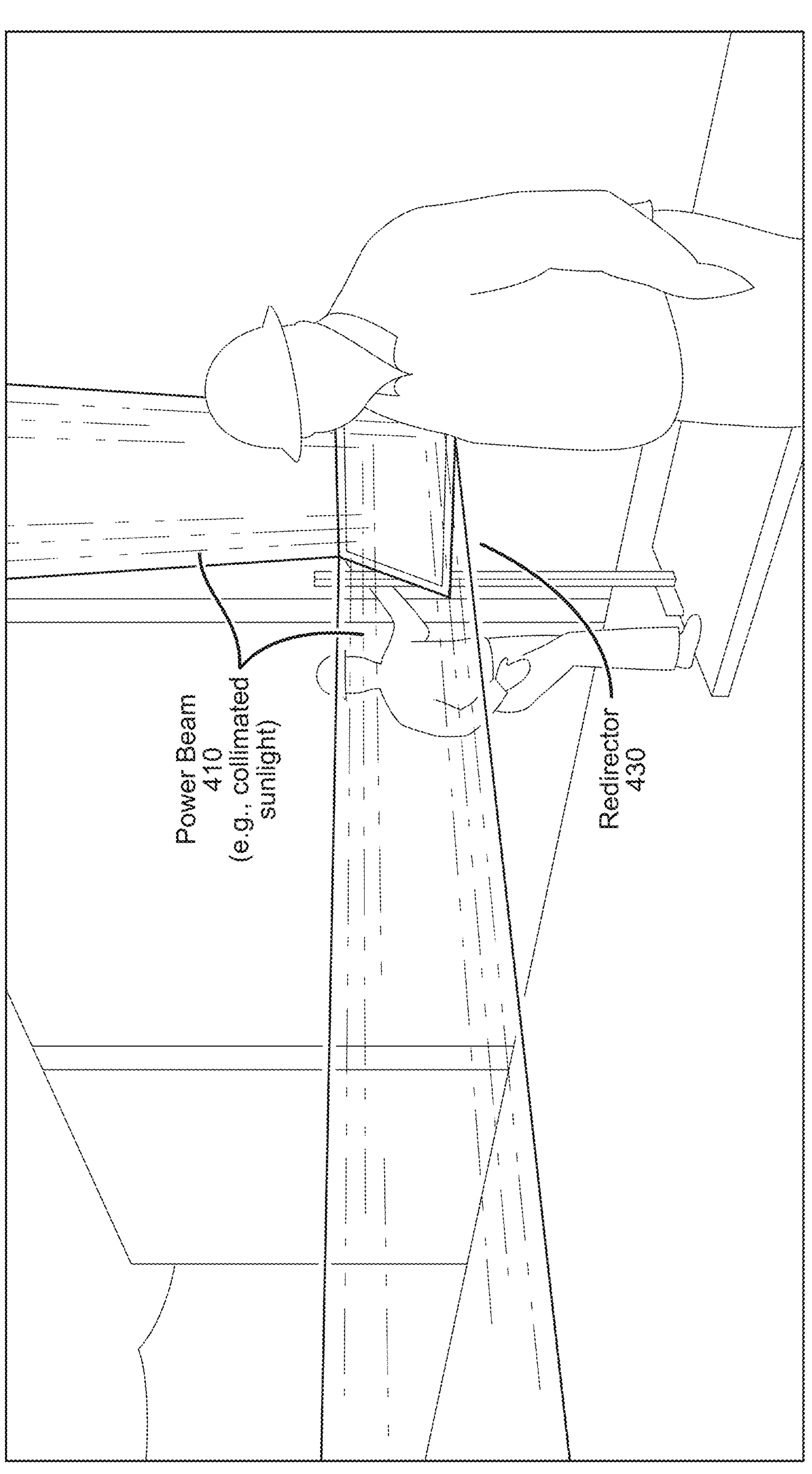
FIG. 3*b* illustrates the real-world power beam being redirected via a redirector.
Figure 3C:
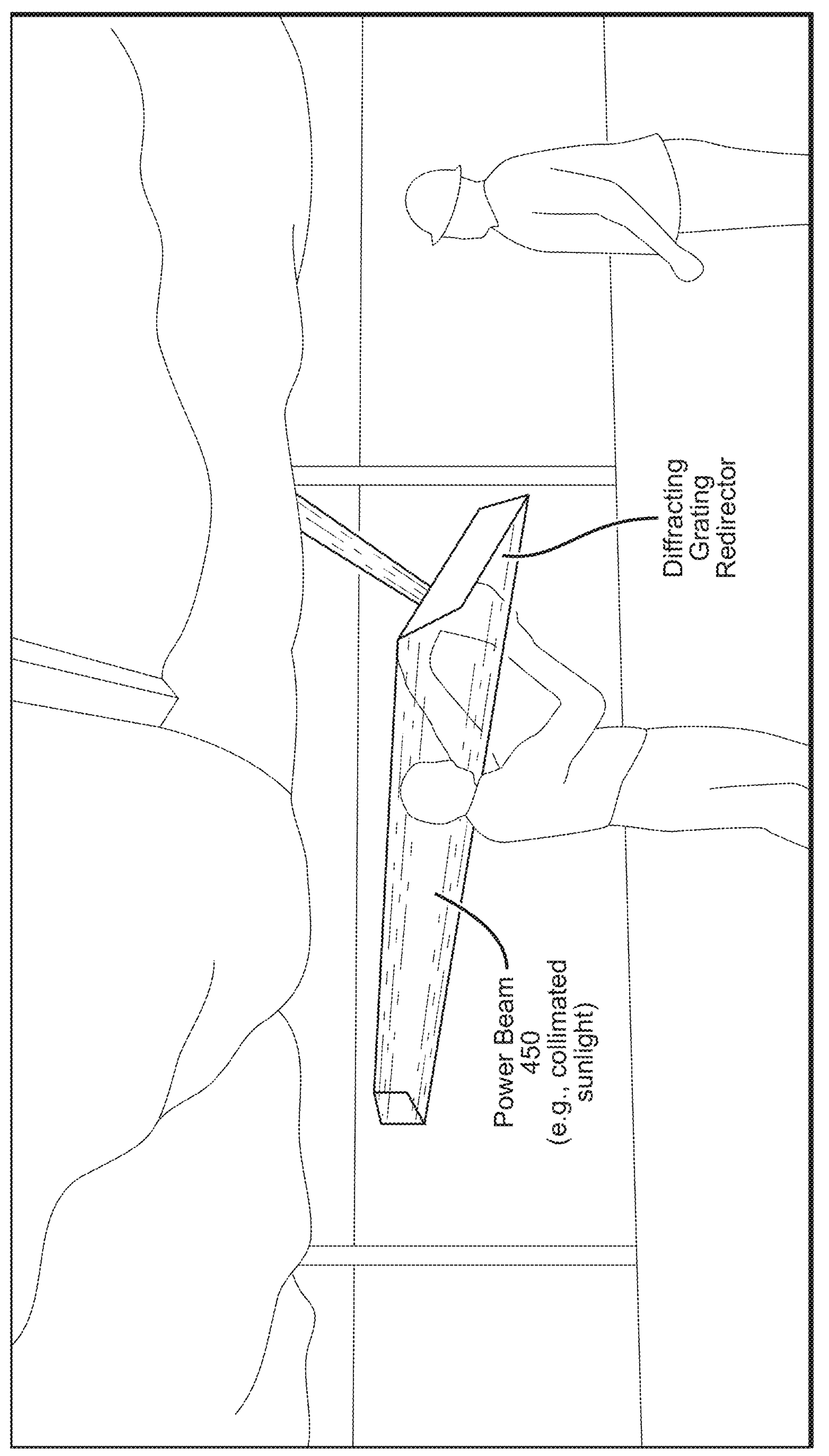
FIG. 3*c* illustrates another real-world power beam passing through free space.

Forms of energy beyond solar energy are also contemplated for conversion, including for example, microwaves, lasers, infrared beams, X-rays, radio waves, or any other form of electromagnetic energy. The energy could be collected and collimated using any suitable assembly. An example collector and collimator for solar energy includes SunCentral™, Inc.'s SunBooster™, (see URL www.suncentralinc.com/technology/our-solution). Further, SunCentral's SunBeamer™ technology can be leveraged to capture, reflect, deflect, refract, scatter, collimate, concentrate, filter, or otherwise manipulate photons within solar energy for use with the inventive subject matter. Examples of SunCentral™, Inc.'s technology in real-world use are shown in FIGS. 3A-3C, and described in more detail below.

It is contemplated that pathway 140 can be located along or within any portion of a building. For example, one or more of the pathways 140 along which a collimated power beam travels can be located within walls of building 105 walls, roofs or ceilings (i.e., within a frame of the building). Other contemplated pathways can be located outside of a building, within a building's room(s), through piping, a combination thereof, or any other suitable location(s). One should appreciate that pathways 140 do not require a conduit to guide collimated power beams 115. Rather, pathways 140 can be through free space because the collimated power beams 115.

Some pathways along which the collimated power beams 115 can lead to a converter 150 configured to convert the energy of power beams 115 to another type of consumable energy. In the example shown, converter 150 converts the solar energy of power beams 115 to electrical energy, possibly via a photo voltaic cell. While it is contemplated that a power beam 115 could be redirected to any suitable converter 150, preferred converters include photovoltaic cells, rectifying antennas, thermophotovoltaic (TPV) cells, thermal chips, thermocouples, or other converters depending on the nature of the energy in the power beam. Converter 150, possibly at a point of power consumption 180, can also capture or store power even when the power represents another form of energy; photosynthesis, steam, heat, kinetic energy, chemical energy, or other forms of energy.

As an alternative example beyond a PVC, consider a use-case where point of power consumption 180 is located in a basement or in a subterranean location lacking access to power. Such below ground locales might require a pump to remove ground water and might require expensive wiring to provide power to the pumps. In some embodiments of the inventive subject matter, a collimated power beam of concentrated sunlight is redirected through free space to the below ground local. The beam can be incident on a heat reservoir (e.g., converter 150) of a Stirling engine (e.g., point of power consumption 180), which drives a mechanical pump.

Converter 150 can advantageously be coupled to point of power consumption 180 (e.g., where the converted energy can be used to run electrical devices) through which a point-of-use device can be powered. The point of power consumption can comprise, among other things, an electrical outlet configured to receive a plug of a device 160 located within or outside building 105.

The term "point-of-use device" is considered to include any device that is configured to utilize converted energy. Example low-powered devices that can leverage power obtained from the beam can include a thermostat, clock, phone, battery recharger, display screen, sensor, an appliance, a sensor, or any other low powered device (i.e. devices that typically only use milliwatts (mW) of power) within operating ranges of a converter. Although some preferred embodiments include low-powered devices, it is also contemplated that larger devices can also benefit from the generated power. Example larger devices can include a microwave, laundry machine, a dryer, a refrigerator, a pump, a conveyor, a toy, a data storage device, a vending machine, a kiosk, or any other high powered device with a suitable power conversion system.

It is contemplated that two or more point of use devices can be coupled to a single converter or point of power consumption 180. An example of this includes two or more low powered devices coupled to a single electrical outlet, or a photovoltaic cell coupled to a laptop, which is coupled to a cellular phone being charged by the laptop.

In some preferred embodiments, point of power consumption 180 or converter 150 can comprise or be coupled with a energy storage device or other storage element that is configured to store energy. The storage elements can store power obtained from the power beam for later conversion. Further, the storage elements can store converted energy for a later use. In the latter embodiment, it is contemplated that the power beam could go through at least two conversions.

The first conversion could occur prior to storage, and the second conversion could occur after storage and before usage at the point-of-use.

All suitable storage devices are contemplated, including for example, an electrochemical storage device (e.g., a battery), a capacitor, graphene supercapacitors, or any other commercially suitable storage device or physical media. Graphene supercapacitors can include small electrodes embedded within graphene units placed on a flexible substrate as described in the article located at URL www.kcet.org/news/rewire/science/more-good-news-on-those-carbon-supercapacitors.html.

It is also contemplated that converter 150, storage device and point of power consumption 180, or any combination thereof, can be embodied as a single unit. Moreover, any of the collector, collimator, redirector, redirector pathway, converter, or point-of-use could be located anywhere in relation to one another. In some embodiments, collector 130 or collimator 115 can be located outside of building 105 or other structures, and energy can be distributed to point of power consumption 180 inside of building 105 or the structure. However, all configurations of wireless power distribution ecosystems are contemplated.

Figure 2A:
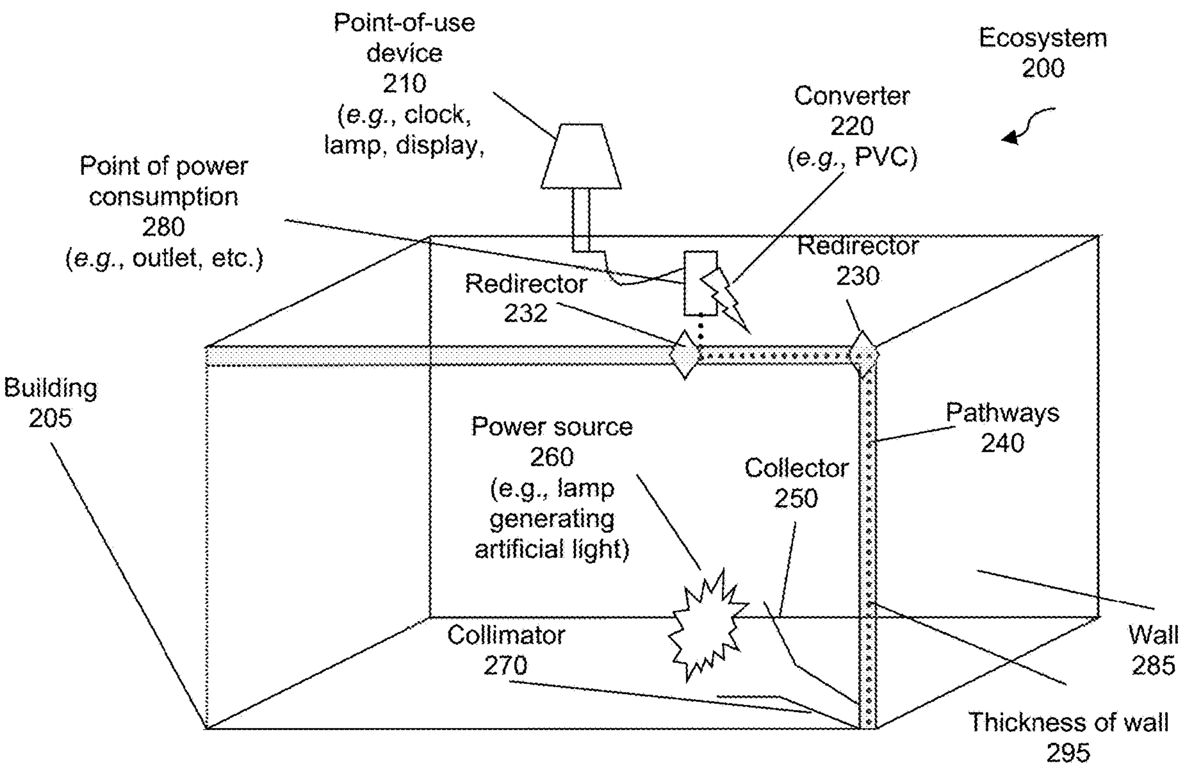
FIG. 2*a* is a schematic of another embodiment of a wireless power distribution ecosystem of the inventive subject matter.

For example, FIG. 2*a* shows an example of another embodiment of a wireless power distribution ecosystem 200 of the inventive subject matter. In this embodiment, artificial light is collected from a power source within building 205 and directed outside of building 205 to a point of use device 210.

In ecosystem 200, a power source 260 (e.g., a lamp, chandelier, fireplace, etc.) located inside a building generates artificial light that can be collected by collector 250, and collimated by collimator 270. The collimated light beams are distributed to another area of building 205 through pathways 240, which can be located within a thickness 295 (e.g., gap) of wall 285 as defined by redirectors 230 and 232. Thickness of wall 295 is presented euphemistically to represent air gaps between wall panels.

The collimated light beam eventually reaches a converter 220, which is configured to convert the energy of the collimated light beam into electricity for use at point of power consumption 280. In this embodiment, converter 220 is further configured to store energy prior to or after a conversion, and is coupled with point of power consumption 280. In some embodiments, it is contemplated that a separate storage device can additionally or alternatively be coupled to the converter 220.

Figure 2B:
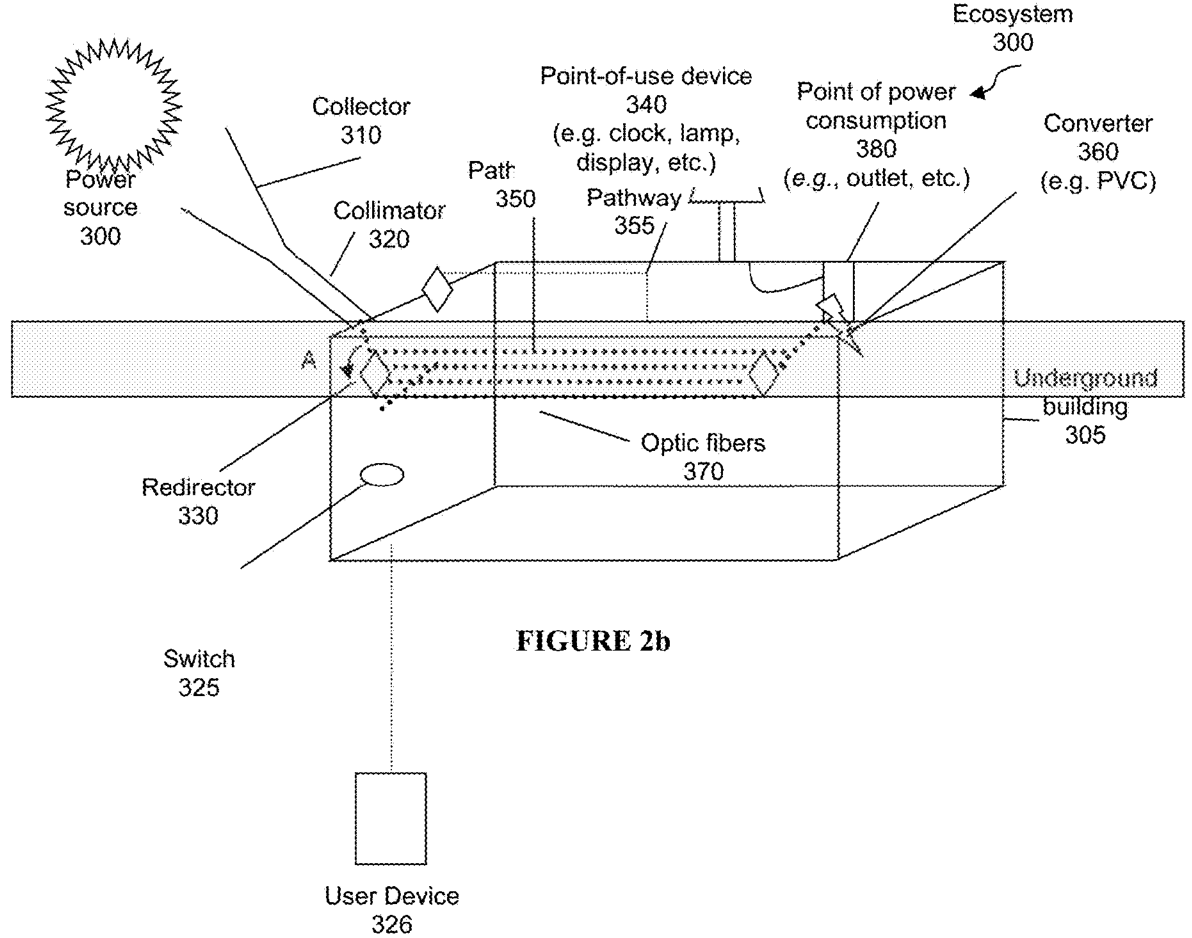
FIG. 2*b* is a schematic of yet another embodiment of a wireless power distribution ecosystem of the inventive subject matter.

As another example consider ecosystem 300 of FIG. 2*b*, ecosystem 300 comprises a power source 300, collector 310, collimator 320, point of power consumption 380 and point-of-use device 340 each located at least partially outside of underground building 305, while a converter 360 and one or more pathways 350 are located inside of underground building 305.

As shown in FIG. 2*b*, it is contemplated that redirector(s) 330 could direct a power beam along any type of pathway 350 or 355, including for example, straight lines, circles, rectangles, squares, triangles, zigzags, swirls, or other arrangement depending on the position one or more of redirector 330. Thus, a pathway 350 or 355 could be static or dynamic, serve an esthetic or functional purpose, or include any or all angles, including right angles, acute angles, or obtuse angles. One should appreciate that the collimated beam can be collimated to a desired flux density relative to the properties of redirector 330, optic fibers 370, or converter 360. For example, the collimated beam can be configured to have an effective cross sectional area that reduces or eliminates a possibility of melting the materials of redirector 330, optic fibers 370, or converter 360. Perhaps the collimated beam has a cross sectional area of four $cm^2$ while maintaining little divergence. Thus the inventive subject matter is considered to include adjusting the flux density of the collimated power beam as a function of the optical properties of other elements in the ecosystem (e.g., index of refraction, opacity, absorption, reflectivity, energy gap, band gap, junction type (e.g., p-n junction, etc.), etc.).

One aspect of the inventive technology can include providing building materials that are configured to provide suitable pathways 350 for collimated power beams, or constructing buildings with power beam pathways 350. For example, wall struts can be constructed that allow for power beams to pass within the interior of wall spaces of the structure to a point of power consumption. Such wall struts can comprises one or more gaps or holes through which pathways 350 pass. Further, wall structures or other internal structural elements can incorporate redirectors 330 (e.g., mirrors, prisms, beam splitters), or can incorporate converters 360.

The term "redirector" can be interpreted broadly, to include any device capable of changing the path of the power beam along a pathway. Examples include a mirror or a beam splitter, depending on the nature of the beam. For example, redirectors for microwaves can be based on parageometrical optics capable of collimating or reflecting microwaves. Thus, redirectors 330 can be configured to operate based on wavelength.

Some embodiments can also include a pathway switch 325 that is configured to alter the direction of the beam along one or more pathways 350. For example, the beam could be configured to pass through one or more of a plurality of redirector pathways, and the pathway switch 325 could cause the beam to shift from one pathway to one or more different pathways by causing movement of redirector 330 or otherwise altering the operating properties of redirector 330. Consider the example shown where redirector 330 has more than one operating position under control of switch 325. If a person operates switch 325, redirector 330 can shift orientation in a manner that causes the collimated power beam to be incident upon a convert that generates consumable energy by user device 326. One should appreciate that switch 325 does not necessarily cause a mechanical change of redirector 330. Switch 325 could cause an optical change of redirector 330, possibly by causing a change of the index of refraction or reflectivity of redirector 330 perhaps through application of thermal energy or voltage different. Examples of suitable technologies that can be adapted for use include those disclosed in U.S. Pat. No. 7,619,809 to Blum et al. titled "Mirror Assemblies Incorporating Variable Index of Refraction Materials", filed Jul. 26, 2006.

It is contemplated that this switch 325 could be operable based on one or more triggers. Examples of triggers include, but are not limited to, movements that could be sensed, physical manipulation, physical conditions, sounds, electronic triggers, or other criteria. The following are non-exclusive lists of exemplary triggers while other triggers are also contemplated. Movements that could be sensed include hand gestures, entering or leaving a room, breathing, sitting, standing, or any other movement. Physical manipulations include the pressing of a button, shifting of a lever, rotation of a dial, or any other manipulation that requires contact with a physical switch. Physical conditions include a change in temperature, a change in brightness, a change in weight, or a change in time, a power outage, an earthquake, or thunderstorm. Sounds include clapping, whistling, footsteps, voices, or winds. Thus, switch 325 can be coupled with one or more sensors and a triggering module having a processor and software instructions stored in a non-transitory computer readable medium where the instructions cause the triggering module to change the state of switch 325 as a function of sensor data from the sensors.

It is further contemplated that the pathway switch, or a different switch, could determine whether collimated energy is stored or converted at a given time, and at what ratio (e.g. through a dimmer switch). For example, a person entering a room could trigger redirection of a pathway to the room he or she is standing in, and a person leaving the room could trigger an end of a conversion period and a start of a storage period. Alternatively or additionally, a person entering a room could trigger redirection of a power beam to the room they are standing in, and a manual shifting of a lever could trigger an end of a 100% conversion period and a start of a 50% conversion and 50% storage period, a 25% conversion and 75% storage period, a 75% conversion and 25% storage period, or any other desired ratio of conversion to storage. This switch 325 could further comprise a feedback system configured to transmit an electronic message to a user device 326, communicatively coupled to the switch 325, indicating information related to the converter or storage system, including for example, the amount of stored energy or the ratio of conversion to storage at a given time.

It is contemplated that the redirector(s) 330 or their corresponding pathways could be disposed completely outside a structure, completely within a structure, or a combination of both. The term "building" can be interpreted broadly to include temporary, semi-permanent, or permanent housing structures; commercial structures; underground structures; open structures; or vehicles.

The following are non-exclusive lists of exemplary buildings, although various other structures are also contemplated. Housing structures can include houses, apartment buildings, apartment units, condominiums, townhouses, barns, animal shelters, hotels, or other structures that house living creatures. Temporary housing structures can include tents, suitably adapted shipping containers, emergency structures, trailers, recreational vehicles, or other types of structures that can be considered temporary. Commercial structures can include sports stadiums, office buildings, warehouses, garages, retail stores, or other structures used for commercial purposes. Underground structures can include tunnels, basements, sewers, mines, swimming pools, underground housing structures, underground gym, underground sports arenas, underground commercial structures, or other structures that might not have direct access to sunlight. Open structures include sports stadiums, streets, freeways, parks, pavilions, gardens, gazebos, or other open air structures. Vehicles can cars, vans, airplanes, boars, ships, spacecrafts, trains, buses, or other moving items.

When the redirector(s) 330 are located at least partially within a building 305 or structure, it is contemplated that the corresponding pathway could comprise a lit or exposed portion of the structure, or an unlit or unexposed portion of the structure. Lit or exposed portions include, for example, a room of the building or structure where pathway 350 can be visible. Unlit or unexposed portions include, for example, the area within a wall, carpeting, pipes, heating ducts, underground chambers, ceilings, flooring, building materials, doors, sewers, tunnels, or any combination thereof where the pathway is generally hidden from view or public access. It is contemplated that there could be some overlap between lit or exposed portions and unlit or unexposed portions, depending on what an area is used for at a given time. For example, a basement could be considered a lit or exposed portion where the basement serves as an entertainment room, or an unlit or unexposed portion where the basement serves as a housing unit for electrical wires or pipes. When the corresponding pathway 350 comprises a lit or exposed portion, the beam could also operate as a decorative element before being converted by a converter or stored by a storage device, for example, through the use of optic fibers 370 that run across a ceiling or wall, or used within a display case, etc., as in FIG. 2*b*.

It is also contemplated that a photovoltaic cell (or any other suitable converter 360) could be disposed anywhere within a structure, including lit or exposed portions, or unlit or unexposed portions. One should appreciate that the inventive subject further includes disposing power converters 360 in locations that would be considered non-obvious. For example, photovoltaic cells can be disposed in the interior portion of a wall, possibly mounted on studs and behind dry wall. A collimated sunlight beam can be directed into and through the interior of the wall to the cells where the cells convert the sunlight into electrical output. The wall can be further configured with an electrical outlet providing access to the electrical output from the cells.

As referenced above, FIGS. 3*a*-3*c* illustrate use of actual collimated beams of sunlight that can be adapted for use as a power beam (e.g., 410). The power beams 410 travel across a gymnasium that is currently under construction where the gymnasium is disposed approximately more than 65 feet below ground level. FIG. 3*a* shows collimated sunlight generated using the SunCentral™ SunBooster™ technology, represented as beam generator 420). In this example, sunlight is collected external to the gym and above ground where the sunlight is highly collimated. Beam 410 is directed downward from the ceiling to a makeshift redirector 430 as shown in FIG. 3*b*. The distance from the beam generator 420 to the redirector 430 is approximately 65 feet located in a mezzanine area of the gymnasium. Beam 410 is redirected through free space across the gym as shown in FIG. 3*c*. One should appreciate that the beam can remain highly collimated even across the approximate 100 foot distance to the far wall.

In FIG. 3*c*, the inventor is shown inserting a diffraction grating in power beam 450 and generating a projected rainbow spectrum. Although this particular point-of-use is esthetic, the interaction with the beam illustrates several important points. First, a portion of beam 450 can be used at any position of beam 450. Second, one could replace the redirector 460 with a PVC for power generation, or other beam interaction devices (e.g., redirectors, lights, gratings, converters, etc.). Third, a substantial amount of beam 450 still remains intact across long distances and can be used at distal points-of-use or points of power consumption. Thus, beam 450 can be split into individual beams and redirected to multiple points of use or points of power consumption.

Yet another aspect of the inventive subject matter that should be further appreciated is the collimated beam can also comprise a concentrated beam. Typically, the surface of the earth receives on average about 150 watts of solar power per square meter. Through the use of a concentrator, possibly a SunBooster™ device, the resulting beam can comprise a power density of more than 1000, 2000, or even 5000 or more watts per square meter. Thus, such high power density beams can be converted or stored as discussed previously. In some embodiments, especially embodiments having such high power densities (e.g., at least 5000 $W/m^2$), the energy can be stored using one or more techniques. For example, the power can be stored in batteries, capacitors, flywheels, sand, porcelain, molten salts (e.g., potassium nitrate, calcium nitrate, sodium nitrate, lithium nitrate, etc.), oils, water, or other energy storage techniques known or yet to be invented. Therefore, the energy from the beam can be stored as different types of energy (e.g., electrical energy, mechanical energy, chemical energy, thermal energy, kinetic energy, electro-magnetic energy, etc.).

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

Unless the context dictates the contrary, all ranges set forth herein should be interpreted as being inclusive of their endpoints and open-ended ranges should be interpreted to include only commercially practical values. Similarly, all lists of values should be considered as inclusive of intermediate values unless the context indicates the contrary.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A wireless power beam routing infrastructure system, comprising:
- a power beam generator configured to form a collimated power beam;
- a plurality of structural building elements, wherein the structural building element comprises one or more pathways for the collimated power beam;
- at least one redirector integrated within the plurality of structural building elements wherein the at least one redirector is configured to alter a transmission path of the collimated power beam; and
- a converter integrated within the plurality of structural building elements, wherein the converter is configured to convert a first form of energy from the collimated power beam into a second usable form of energy.

2. The system of claim 1, wherein at least one of the structural building elements comprises a wall strut.

3. The system of claim 2, wherein the wall strut comprises a pathway that includes at least one gap or hole through which the collimated power beam passes.

4. The system of claim 1, wherein the plurality of structural building elements comprise at least one wall, roof, ceiling, or floor.

5. The system of claim 1, wherein the at least one redirector comprises one or more of a mirror, a prism, or a beam splitter.

6. The system of claim 1, wherein the converter comprises a photovoltaic cell.

7. The system of claim 1, further comprising one or more pathway switches that alter the direction of the collimated power beam along at least one of the one or more pathways.

8. The system of claim 7, wherein the pathway switch is operable based on at least one trigger.

9. The system of claim 8, wherein the at least one trigger comprises at least one of a sensed movement, a physical manipulation, a change in one or more physical conditions, an electronic trigger or a sound.

10. The system of claim 1, further comprising an energy storage device integrated within at least one of the plurality of structural building elements, wherein the energy storage device is configured to store energy obtained from the collimated power beam or energy converted by the converter from the collimated power beam.

11. The system of claim 1, wherein the collimated power beam comprises solar energy.

12. The system of claim 1, wherein the collimated power beam comprises at least one of microwaves, laser light, infrared light, X-rays, or radio waves.

13. The system of claim 1, wherein the one or more pathways route through a thickness of a wall, wherein one or more of the at least one redirector is integrated within the thickness of the wall.

14. The system of claim 1, wherein the one or more pathways further travel through free space within a building structure comprising the plurality of structural building elements.

15. The system of claim 1, wherein the converter is disposed in an interior portion of a wall.

16. The system of claim 15, further comprising an electrical outlet located on the wall wherein the electrical outlet provides access to electrical output from the converter.

17. The system of claim 1, wherein the power beam generator adjusts a flux density of the collimated power beam based on optical properties of one or more of the redirector, the converter, or the plurality of structural building elements.

18. The system of claim 1, wherein one or more of the plurality of structural building elements comprise at least one of either a lit or exposed portion or an unlit or unexposed portion of a structure.

19. The system of claim 1, further comprising optic fibers integrated within one or more of the plurality of structural building elements, wherein the optic fibers are configured to transmit the collimated power beam.

20. The system of claim 1, wherein the collimated power beam comprises a concentrated power beam having a power density of at least 1000 watts per square meter.

21. A method for routing power beams within a building infrastructure, the method comprising:

generating a collimated power beam using at least one power beam generator, wherein the at least one power beam generator is configured to transmit the collimated light beam through one or more structural building elements, wherein the structural building element comprises one or more pathways for the collimated power beam;

redirecting the collimated light beam using at least one redirector integrated within the plurality of structural building elements wherein the at least one redirector is configured to alter a transmission path of the collimated power beam through the one or more structural building elements; and converting the collimated power beam using at least one converter integrated within the plurality of structural building elements, wherein the converter is configured to convert energy from the collimated power beam from a first form of energy into a second form of energy.

22. A method for constructing a wireless power beam routing infrastructure within a building, the method comprising:

configuring a power beam generator to form a collimated power beam;

assembling a plurality of structural building elements of the building, wherein one or more of the structural building elements comprises one or more pathways for the collimated power beam;

positioning at least one redirector integrated within the plurality of structural building elements, wherein the at least one redirector is configured to alter a transmission path of the collimated power beam; and integrating a converter within the plurality of structural building elements, wherein the converter is configured to convert a first form of energy from the collimated power beam into a second form of energy.

* * * * *